(12) United States Patent
Bach

(10) Patent No.: US 7,750,738 B2
(45) Date of Patent: Jul. 6, 2010

(54) PROCESS, VOLTAGE AND TEMPERATURE CONTROL FOR HIGH-SPEED, LOW-POWER FIXED AND VARIABLE GAIN AMPLIFIERS BASED ON MOSFET RESISTORS

(75) Inventor: Elmar Bach, Villach (AT)

(73) Assignee: Infineon Technologies AG, Neubiberg (DE)

( * ) Notice: Subject to any disclaimer, the term of this patent is extended or adjusted under 35 U.S.C. 154(b) by 36 days.

(21) Appl. No.: 12/274,649

(22) Filed: Nov. 20, 2008

(65) Prior Publication Data

US 2010/0123521 A1    May 20, 2010

(51) Int. Cl.
*H03G 3/00*    (2006.01)
(52) U.S. Cl. .................. 330/278; 330/307; 330/277
(58) Field of Classification Search ............ 330/278, 330/307, 277
See application file for complete search history.

(56) References Cited

U.S. PATENT DOCUMENTS

| | | | | |
|---|---|---|---|---|
| 4,574,249 | A * | 3/1986 | Williams | 330/59 |
| 6,642,789 | B2 * | 11/2003 | Ivanov et al. | 330/253 |
| 6,987,421 | B2 * | 1/2006 | Blanken | 330/258 |
| 7,205,817 | B1 * | 4/2007 | Huang et al. | 327/308 |
| 7,515,001 | B2 * | 4/2009 | Kamiya | 330/285 |
| 7,525,333 | B1 * | 4/2009 | Bertin | 324/769 |

* cited by examiner

*Primary Examiner*—Patricia Nguyen
(74) *Attorney, Agent, or Firm*—Slater & Matsil, L.L.P.

(57) ABSTRACT

An integrated circuit includes a first, diode-connected MOSFET and a second, linearly operated MOSFET serving as resistor. A current source may provide a current such that the second MOSFET shows a transconductance constant over temperature and process variations. In one embodiment the MOSFET devices are included in a variable gain amplifier for adjusting the gain.

20 Claims, 10 Drawing Sheets

PROCESS, VOLTAGE AND TEMPERATURE CONTROL FOR HIGH-SPEED, LOW-POWER FIXED AND VARIABLE GAIN AMPLIFIERS BASED ON MOSFET RESISTORS

TECHNICAL FIELD

This invention relates to the field of high-speed amplifiers and their calibration. In particular, the invention relates to a circuit providing a tuning voltage for operating a MOSFET as a resistor, which may be used for adjusting an amplifier.

BACKGROUND

High-speed amplifier circuits are used for amplifying signals in a wide variety of employments, wherein a variable gain amplifier (VGA) varies its gain depending on a control signal. To obtain a stable process and temperature independent gain an accurate control signal must be provided, wherein the control signal should take various varying operating conditions into account, for example, temperature or aging processes.

High-speed VGAs can not be designed based on an adjustable ratio of a feedback network, for example, as known from conventional resistive feedback paths, which are operated in negative feedback around an operational amplifier. The bandwidth in such a closed-loop system is determined by the bandwidth of the operational amplifier (OpAmp) that can be achieved with sufficient phase margin at minimum gain setting. Usually the serviceable bandwidth of an OpAmp degrades proportionally to the effective gain of the system. Any pole present in the feedback network reduces the obtainable phase margin thus limiting the available bandwidth of the closed-loop. In cases requiring high adjustability extra components, for example, switches, must be added to the feedback network. These components add to parasitic capacitances present in the feedback network, such that a gain dependent feedback pole may arise. Hence high-speed variable gain amplifiers are commonly designed as open-loop systems.

To obtain a stable process and a temperature independent gain, tuning circuits can be added to an open-loop amplifier arrangement as means for providing a constant gain. Often a two-point calibration of the gain versus gain-control signal relation is implemented in which both the maximum and minimum gains are controlled by extra circuitry. Based on these extreme settings intermediate gain values can be produced.

In a conventional example, for tuning circuitry, copies of the main amplifier, so-called replica circuits, were used for generating control signals. That is the amplifier circuit comprises an open-loop main amplifier for amplifying the input signal as desired. Control signals for adjusting the amplification of the main amplifier are generated in parallel operated replica circuits comprising essentially identical elements, in particular, an identical amplifier. A first replica circuit is employed for producing a first control signal for minimum gain and a second replica circuit is employed for producing a second control value for adjusting maximum gain value. The replica circuits are operated in a closed loop, i.e., the circuits comprise a feedback loop. A reference input signal is provided to each replica circuit and each replica circuit comprises a resistive divider to adjust control values for a minimum and maximum gain. The control signals produced in the replica circuits are coupled to the main amplifier.

As an ever-challenging problem the power consumption of the amplifier circuit must be minimized. Accordingly power consumption of peripheral devices such as the tuning circuits should have a minimum impact on the power consumption of the total variable gain system.

Hence there is a need for a new circuit for controlling the amplification of an input signal.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 depicts a schematic of a circuit comprising an input stage, a load stage and a current domain processing stage in between;

DETAILED DESCRIPTION OF ILLUSTRATIVE EMBODIMENTS

The present invention will now be described with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances well known processes and steps have not been described in detail in order not to unnecessarily obscure the present invention.

The transconductance of a MOSFET transistor in saturation is given by:

$$g_{m\_MOSFET\_saturated} = \mu \cdot C'_{ox} \cdot \left(\frac{W}{L}\right)_{sat} \cdot (V_{gs\_sat} - V_{th0}) \tag{1}$$

with $\mu$ being the mobility of charge carriers, $C_{ox}'$ being the specific oxide capacitance, $\left(\frac{W}{L}\right)_{sat}$ being the width to length ratio of the transistor channel of the saturated transistor, $V_{gs\_sat}$ being the gate-source voltage, and $V_{th0}$ being the threshold voltage of the transistor without body effect.

Similarly the resistance of a transistor in linear operation is given by:

$$R_{MOFSET\_linear} = \frac{1}{\mu \cdot C_{ox} \cdot \left(\frac{W}{L}\right)_R \cdot (V_{gs\_R} - V_{th0})} \quad (2)$$

with $$\left(\frac{W}{L}\right)_R$$

being the width to length ratio and $V_{gs\_R}$ being the gate-source voltage of the transistor in linear operation.

In an operating point of an electrical circuit, where the gate-source voltage in saturation is identical to the gate-source voltage in linear operation, that is when:

$$V_{gs} = V_{gs\_sat} = V_{gs\_R},$$

the resistance of the MOSFET transistor in linear operation can be put in relation to the transconductance of the MOSFET operating in saturation. Accordingly with:

$$V_{gs\_sat} - V_{th0} = \frac{g_{m\_MOSFET\_saturated}}{\mu \cdot C_{ox} \cdot \left(\frac{W}{L}\right)_{sat}} \quad (4)$$

replacing $V_{gs\_R} - V_{th0}$ in equation (2) the resistance of the MOSFET transistor is given by:

$$R_{MOFSET\_linear} = \frac{\left(\frac{W}{L}\right)_{sat}}{\left(\frac{W}{L}\right)_R \cdot g_{m\_MOSFET\_saturated}}. \quad (5)$$

Assuming a constant transconductance $g_{m\_MOSFET\_saturated}$ can be provided independent of environmental variations, i.e., independent of, for example, temperature and supply voltage as well as process corners, then the resistance of the transistor in linear operation $R_{MOSFET\_linear}$ will be constant too.

Figure 1:
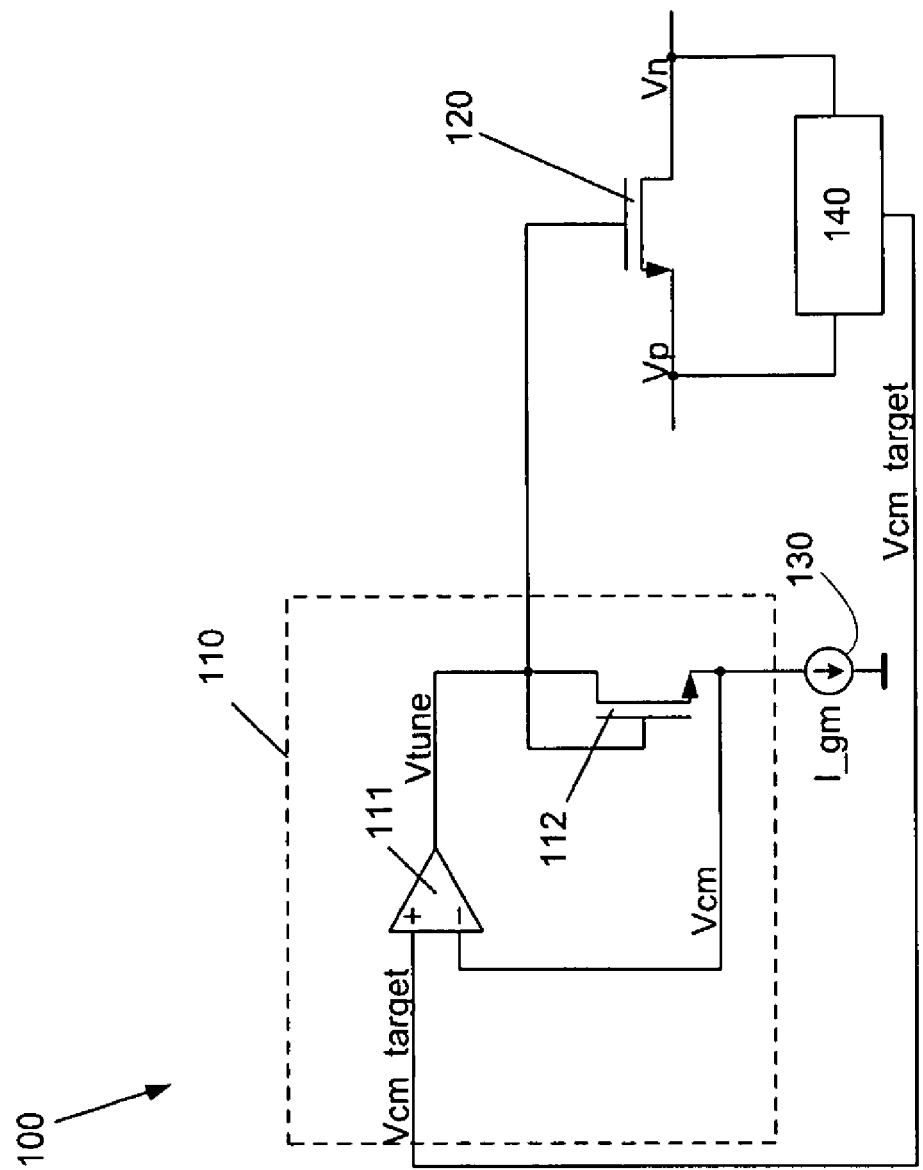
FIG. 1 depicts an embodiment of a tuning voltage generator circuit coupled to a MOSFET, which is operated as a linear resistor.

FIG. 1 depicts a schematic circuit 100 comprising a tuning voltage generator 110 coupled to a MOSFET transistor 120. Voltage generator 110 comprises operational amplifier (OpAmp) 111 coupled to an N-MOSFET 112, wherein N-MOSFET 112 is diode connected. The drain and gate of transistor 112 are thus shorted; hence transistor 112 is operated in saturation always. Diode connected transistor 112 is coupled with its gate and drain to the output voltage $V_{tune}$ of OpAmp 111.

The source of transistor 112 is coupled to a bias current source 130 drawing a current I_gm through transistor 112, wherein the current is controlled such that the transconductance of diode connected transistor 112 is constant over process, temperature and voltage variations. This can be achieved by an additional gm-control circuit, which is commonly available in analog front ends comprising linear continuous time filters based on the ratio of a transconductance $g_m$ and a capacitance C, so-called gm/C filters. A sketch of a suitable current source for providing I_gm is described later in this specification.

The source of diode connected transistor 112 is also coupled in a feedback loop to the inverting input of operational amplifier 111, so OpAmp 111 receives the source voltage $V_{cm}$ of transistor 112 at its inverting input.

Voltage generator 110 is coupled to an N-MOSFET transistor 120 for providing Vtune as control voltage to the gate of N-MOSFET 120. This transistor 120 is of the same type as diode connected transistor 112 and uses the same threshold voltage, i.e., regular threshold voltage or low threshold voltage, and oxide thickness, but is operated in its linear operating range. Drain and source of transistor 120 are coupled to a voltage sensing block 140.

Block 140 thus receives the source and drain voltage $V_p, V_n$ of transistor 120 as input voltage and outputs the average voltage $V_{cm\_target}$ of the input voltages, i.e., $$V_{cm\_target} = \frac{V_p + V_n}{2}. \quad (6)$$

The average of source voltage and drain voltage constitutes a sufficient approximation of the source voltage as the source and drain alternate during operation due to the differential implementation of the VGA circuit described later. Block 140 in one embodiment can be a high-ohmic resistor divider comprising two equal resistors in series, wherein voltage $V_{cm\_target}$ can be taken at the center tap between the two resistors.

Voltage $V_{cm\_target}$ is coupled to the non-inverting input of OpAmp 111, which in this way is coupled to the source voltage $V_{cm}$ of diode connected transistor 112 and voltage $V_{cm\_target}$. Accordingly OpAmp 111 aims at minimizing the difference between its input voltages $V_{cm}$ and $V_{cm\_target}$, such that $V_{cm}$ equals $V_{cm\_target}$. Consequently, as diode connected transistor 112 and linearly operated transistor 120 are coupled with their gates to the same voltage Vtune and with Vcm almost Vcm_target the circuit floats around a common-mode level given by Vp and Vn. The gate-source voltages of diode connected transistor 112 and linear operated transistor 120 thus can be considered to be identical; hence equation (3) can be considered to be fulfilled.

In this way linear operated transistor 120 is operated as a linear resistor, wherein it is possible to adapt the operation to different operating points determined only by the circuit in which transistor 120 is embedded, i.e., coupled to with its source and drain.

Considering above given equation (5) the resistance of linear operated transistor 120 can also be adapted, for example, by adjusting the ratio of the width to length ratios of the involved transistors. Accordingly by increasing the $(W/L)_R$ ratio of the linear operated transistor or decreasing the width to length ratio $(W/L)_{sat}$ of the saturated transistor the resistance of the linear operated transistor can be decreased.

Figure 2:
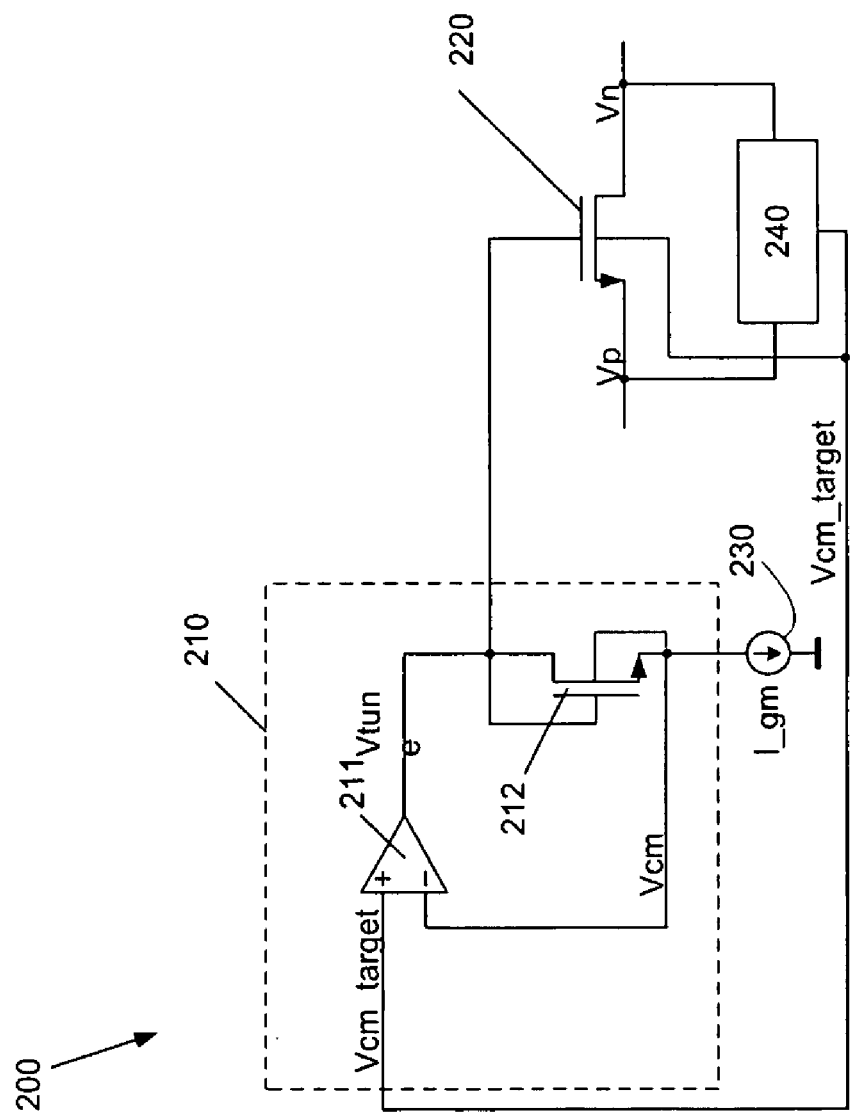
FIG. 2 depicts a variation of the tuning voltage generator circuit coupled to a MOSFET.

FIG. 2 depicts a variation of the circuit. Operational amplifier 211, bias current source 230 and sensing circuit 240 are identical to the corresponding devices shown in circuit 100, furthermore the wiring between the devices is identical. In contrast to circuit 100 diode connected transistor 212 is bulk-source shorted to avoid the so-called body back-gate effect of the NMOS devices. The body effect of linear operated transistor 220 is minimized by connecting the bulk to the sensed common-mode voltage $V_{cm\_target}$. In particular the bulk of saturated, or diode-connected, transistor 212 is shorted to its source and the bulk of linearly operated transistor 220 is coupled to the output of circuit 240, i.e., to $V_{cm\_target}$. While this connection between bulk and source of the transistors does not influence the operation principles the characteristics of the devices are improved in that the threshold voltage is lowered.

The described circuits thus disclose a tuning voltage generator circuit comprising a diode-connected MOSFET operated by a current source to have a transconductance constant over process, temperature and voltage variations. In particular, the tuning voltage generator comprises the diode-connected MOSFET in the negative feedback path of the operational amplifier, and the current source coupled to the diode-connected MOSFET is controlled such that the transconductance of the diode-connected MOSFET is maintained constant as desired. The tuning voltage generator is coupled to a linearly operated MOSFET acting as linear resistor. The linearly operated MOSFET is coupled to the tuning voltage generator such that it shares a common gate-source voltage with the diode-connected transistor. This can be achieved by connecting the gates of both the transistors to the output of the OpAmp comprised in the tuning voltage generator circuit, wherein the OpAmp receives the source voltage of the diode-connected transistor at its inverting input and the average of source voltage and drain voltage of the linearly operated MOSFET at its non-inverting input, such that the OpAmp enforces a common gate-source voltage. The average of the source and the drain voltage of the linearly operated MOSFET are coupled to a high-ohmic voltage divider, from which the average is tapped at its center tap.

Variable resistors, for example, can be employed to adjust the gain of amplifiers and, in particular, the gain of variable gain amplifiers. In contrast to conventional resistors MOSFET resistors can be easily switched on or off by providing a tuning voltage to their gate. They can be turned off by reducing their gate-source voltage to a level at which the impedance of the MOSFET is sufficiently high to be disregarded. By employing an array of parallel connected MOSFET resistors it is possible to implement a highly flexible gain adjustment, wherein digital control is possible by turning on or off appropriate switches to supply a voltage of $V_{tune}$ or $V_{off}$. Accordingly various gain-to-gain-control relations can be implemented, e.g., linear control or linear-in-log-domain controls, wherein linear-in-log-domain controls are preferred in a read signal path of a hard disk drive.

Figure 3:
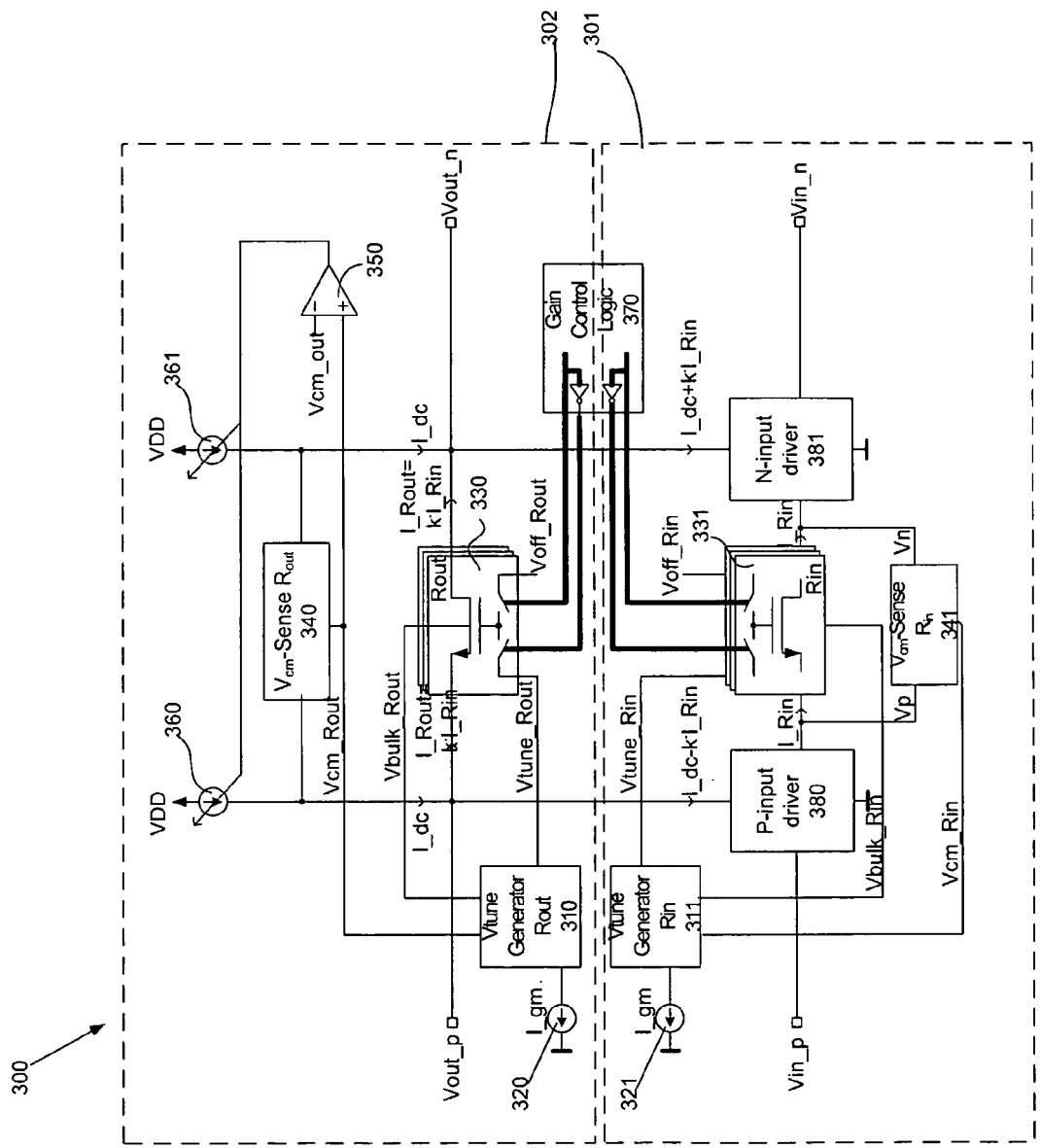
FIG. 3 depicts a circuit of a variable gain amplifier comprising tuning voltage generator circuits.

FIG. 3 schematically depicts a circuit of a differential variable gain amplifier (VGA) 300 for amplifying a differential input signal provided at input terminals $V_{in\_p}$ and $V_{in\_n}$ to produce a differential output signal at output terminals $V_{out\_p}$ and $V_{out\_n}$ respectively. VGA circuit 300 comprises two voltage tuning generators 310, 311 driving linearly operated N-MOSFETs as linear resistors 330 and 331. The gain of the VGA 300 circuit is determined by the ratio of the MOSFETs serving as ohmic resistors, i.e., the gain is proportional to the ratio of the resistance $R_{out}$ 330 in the output stage 302 to the resistance $R_{in}$ 331 in the input stage 301. As the circuit comprises an input stage and an output stage electronic elements in circuit 300 are indexed accordingly using indexes "in" and "out".

Tuning voltage generators 310, 311 can be those as sketched in FIG. 1 or 2. As it is assumed that the common mode output voltages of the input and the output signal are not identical two tuning voltage generators 310, 311 operating at differing voltages are provided. Each is coupled to a current source 320, 321 providing a current to the voltage tuning generators, i.e., in particular to the comprised diode-connected MOSFETs, wherein the current sources are adapted and configured to provide a current maintaining the MOSFETs in a transconductance constant over process, temperature and voltage variations. An embodiment of a suitable current source circuit is described later.

Input resistor $R_{in}$ 331 and output resistor $R_{out}$ 330 are composed of a network of parallel connected N-MOSFETs operated as linear resistors, which may be of equal or different resistance. The resistance value of each of the resistors 330, 331 can be set by providing tuning voltages $V_{tune\_Rin}$ or $V_{tune\_Rout}$ by some gain control logic for switching the transistors on or by coupling the transistors to a voltage $V_{off\_Rin}$ or $V_{off\_Rout}$ respectively, which in each case for example may be $V_{SS}$, for switching them off. For that purpose tuning voltage generator 310 is coupled to resistor $R_{out}$ 330 and tuning voltage generator 311 is coupled to resistor $R_{in}$ 331 for providing suitable voltages $V_{tune\_Rout}$ and $V_{tune\_Rin}$. The ratio of the resistors $R_{in}$ and $R_{out}$ thus can be set by gain control logic block 370, which is coupled to the resistors and which may either provide a tuning voltage $V_{tune\_Rin}$ or $V_{tune\_Rout}$ to the gate of a transistor for switching the transistor into linear operation or couple the gate of a transistor to a voltage of $V_{off\_Rin}$ or $V_{off\_Rout}$ for switching a transistor off. A transistor switched to linear operation accordingly decreases the overall resistance as its conducting channel is switched in parallel to other transistors. Vice versa a transistor coupled to zero voltage takes an infinite resistance value and hence can be disregarded.

The source and drain voltages of resistors $R_{out}$ and $R_{in}$ are coupled to circuits 340, 341, which provide the average of these voltages as $V_{cm\_Rout}$ and $V_{cm\_Rout}$ to the respective voltage tuning generator. Furthermore the bulk voltages $V_{bulk\_Rin}$ and $V_{bulk\_Rout}$ of the transistors are coupled to the tuning voltage generators 310, 311 for coupling these voltages to the average of the source-gate voltages.

In one embodiment circuits $V_{cm}$-Sense$_{Rin}$ 341 and $V_{cm}$-Sense$_{Rout}$ 340 can be high-ohmic voltage dividers comprising two high-ohmic resistors in series wherein the average of the applied voltages can be tapped from a center tap.

In one embodiment amplifier 350 may be added to circuit 300 as an option. Amplifier 350 serves to adjust the common voltage output of circuit 300 to a desired common voltage $V_{cm\_out}$ by controlling the controllable current sources 360, 361 accordingly. As illustrated amplifier 350 is coupled with its input terminals to the output of these current sources via circuit $V_{cm}$-Sense$_{Rout}$ 340 to control these to output a current such that a desired common mode output voltage of $V_{cm\_out}$ is achieved. In the embodiment given in circuit 300 current sources 360, 361 are assumed to act in an inverted manner to a control voltage provided by amplifier 350. This explains why the target common-mode voltage Vcm_out is coupled to the negative input of amplifier 350. Current sources 360, 361 may be implemented with PMOS devices.

VGA 300 also comprises driver circuits 380, 381 coupled to the positive input and the negative input respectively. Each of these circuits 380, 381 forces an output voltage of Vp, Vn being proportional to the input voltages Vin_p and Vin_n respectively by a gain factor Ki. Furthermore these driver circuits sense input current $I_{Rin}$ and provide a multiple of that, i.e., $I_{Rin}$ multiplied by factor K, to the output stage 302 of VGA 300. A current of $K \cdot I_{Rin}$ is forced upon resistor $R_{out}$, which accordingly produces an output voltage across $R_{out}$. As mentioned above the common mode voltage output can be controlled to a desired value by operating amplifier 350.

In this way a differential input signal $V_{in}$, which is provided to the positive and the negative input terminal $V_{in\_p}$ and $V_{in\_n}$ respectively, is amplified by a DC gain factor of:

$$A = \frac{K_i \cdot K \cdot R_{out}}{R_{in}},$$

thus producing an amplified output signal via positive output terminal $V_{out\_p}$ and the corresponding negative output terminal $V_{out\_n}$.

Figure 4:
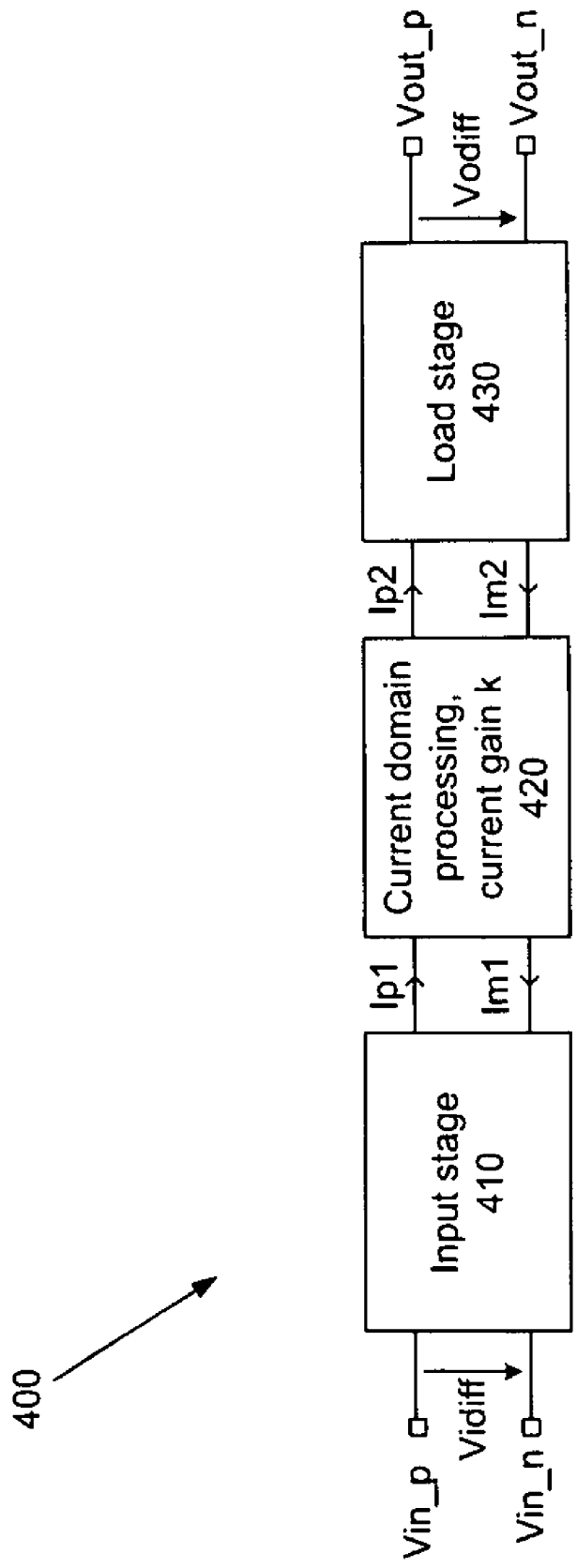

FIG. 4. shows a block schematic 400 of another embodiment of a differential VGA circuit, wherein the input driver circuits 380, 381 may comprise a current-domain signal processing chain of gain K. In this embodiment input stage 410, which receives differential input signal $V_{idiff}$, comprises a first controlled MOSFET resistor driven by a tuning voltage generator circuit as described above. A drive and sense block supplying current outputs a differential current of Ip1, Im1 as input current to a second signal processing stage 420. The second processing stage 420 processes its input current thus producing a differential output current Ip2 and Im2 respectively, which is fed into a load stage 430. Load stage 430 comprises a second controlled MOSFET resistor and a second tuning voltage generator. By feeding differential current Ip2, Im2 through the second MOSFET resistor a current-to-voltage conversion is performed, such that load stage 430 outputs an output voltage $V_{odiff}$. In this way the MOSFET resistor comprised in load stage 430 may be positioned at the end of a signal processing chain applying a gain of factor K to its differential input current Ip2 and Im2.

FIGS. 5a to 5d depict various embodiments of an input stage circuit 500. Each of these embodiments may be the input stage 410 as described above and which may replace the input stage 301 of above described circuit 300. That is output terminal 510a is coupled to $V_{out\_p}$ of circuit 300 and output terminal 510b is coupled to $V_{out\_n}$ of circuit 300 thus connecting the output terminals of a circuit 500 to resistor $R_{out}$ 330 of circuit 300. As the circuits depicted in FIGS. 5a to 5c differ in the design of the feedback loop the features common to the embodiments are described for all circuits 500.

Circuits 500 implement an input stage circuit, which also senses the current $I_{Rin}$ flowing through input resistor Rin 520. Circuit 500 comprises two identical sub-circuits 530, 531 which are symmetrically arranged with input resistor 520 as center, wherein one sub-circuit couples to the source terminal and the other coupling to the drain terminal of the input resistor. Sub-circuits 530, 531 correspond to circuits 380, 381 in FIG. 3. Each of the sub-circuits comprises a current-feedback loop, which may have various designs. As the design of sub-circuits 530, 531 is identical and the processing of the positive and negative input signal correspond the following description given for sub-circuit 530 also applies to sub-circuit 531.

The positive input signal $V_{in\_p}$ couples to the gate of input N-MOSFET 540, which is operated in saturation. Optionally MOSFET 540 can be bulk-source connected as depicted in the drawing. The current flowing into MOSFET 540, i.e., current I_gm, is controlled to be constant by a negative feedback loop sensing a deviation from the expected DC current. That is power supplies 550, 551 each provide a bias current of I_gm+I_fb, from which bias current portion I_fb is fed into a feedback loop and current portion I_gm flows through input MOSFETs 540, 541. Feedback loops maintain current portion I_fb and I_gm constant by controlling the gates of feedback transistors 560, 561.

Current portion I_Rin is forced through input resistor Rin 520 by the difference between voltages Vp and Vn, which are proportional to the input voltages Vin_p and Vin_n, wherein I_Rin is provided by feedback transistors 560, 561. Accordingly a current of I_gm−I_Rin flows through feedback transistor 560 and a current of I_gm+I_Rin flows through feedback transistor 561.

Mirror transistors 570, 571 share the voltage of the feedback loop and thus mirror the current of I_gm−I_Rin and I_gm+I_Rin respectively via terminals 510a, 510b to a connected output stage.

The current flowing into input N-MOSFET 540 is controlled to be constant by the negative feedback loop, which senses a deviation from an expected DC current. The loop amplifies this difference from the DC target and controls the gates of feedback transistors 560, 561 to provide a correction current such that the difference is balanced to zero and the DC current through the input MOSFETs 540, 541 is constant.

Resistor Rin 520, which comprises a plurality of parallel connected transistors to be operated as resistors, is operated in linear mode. In order to apply the above mentioned operating principle to input resistor 520 tuning voltage generator 511 connects to common voltage Vcm_Rin, sensed with the two high-ohmic resistors Rcm, and provides tuning voltage Vtune_Rin. The constant transconductance bias current I_gm is provided by current source 521.

Figure 5A:
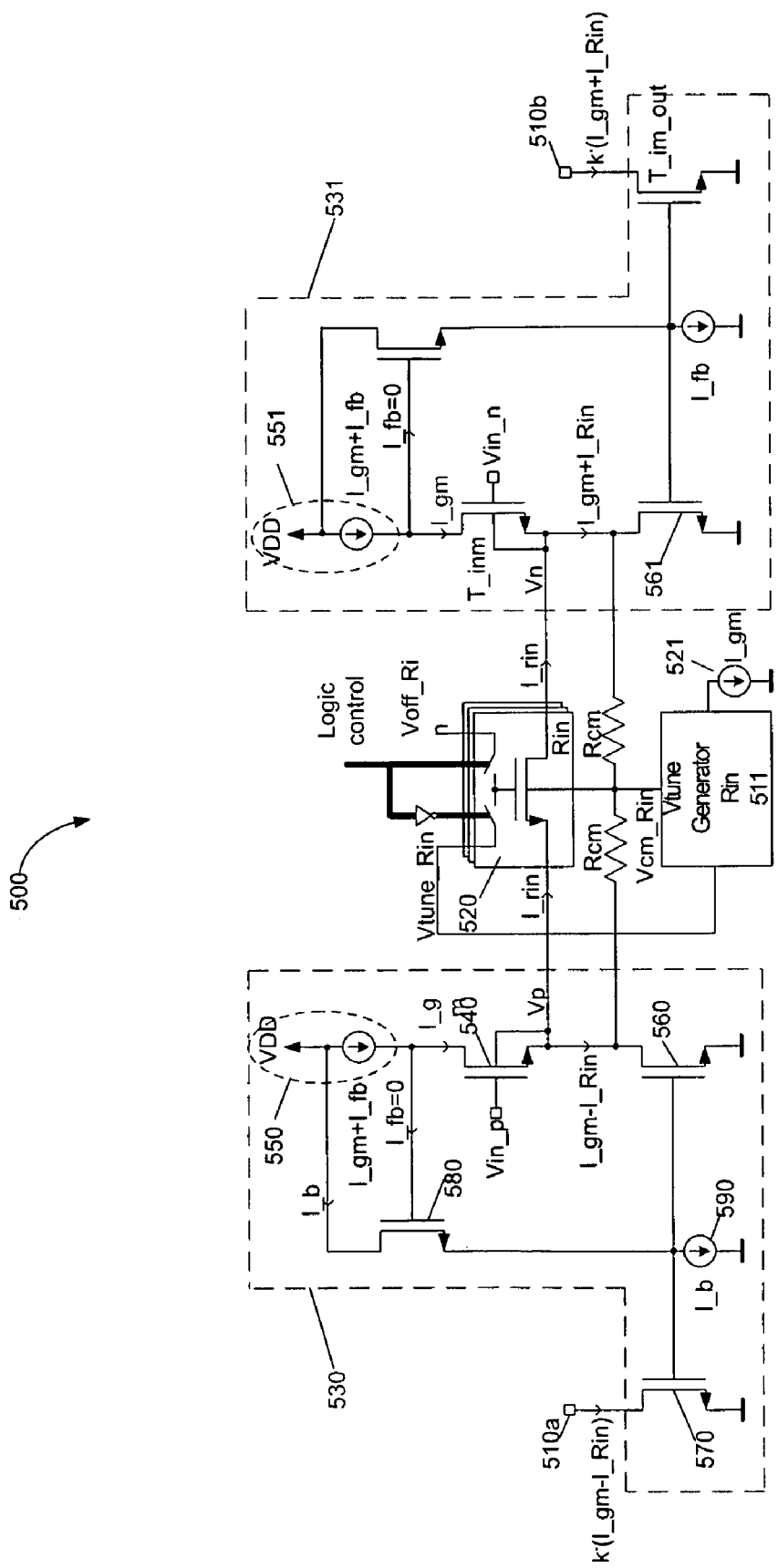
FIGS. 5a-5d depict schematics of an input stage of a variable gain amplifier circuit.

The negative feedback loop may be implemented in various designs. Turning now to FIG. 5a the feedback loop in one embodiment can be implemented as an N-MOSFET 580, which is coupled with its drain to power supply 550, with its gate to the drain of input N-MOSFET 540 and with its source to the shorted gates of feedback transistor 560 and mirror transistor 570. The source of N-MOSFET 580 is furthermore coupled to current source I_b, which provides the bias current flowing through N-MOSFET 580.

The gate of transistor 580 in this embodiment is thus coupled to the drain of input transistor 540. The feedback current I_fb as plotted in the sketch is thus negligible and assumed as zero.

The feedback loops maintain current portion I_gm constant, via control of the gates of feedback transistors 560, 561 through the source-follower 580, 581. Both loops comprise a high-impedance gain node at the gate of transistors 580, 581. At these nodes an error current that is added in parallel to I_gm is amplified into a large voltage which is forced to the gates of feedback transistors 560, 561 which in turn provide a correction current to force the error current in parallel to I_gm to zero. In closed-loop operation the voltage swing at the gate of the feedback transistor 580 is only slightly larger than the swing at the gates of transistors 560 and 570.

Note that in the sketched circuit feedback transistor 560 and mirror transistor 570 optionally may be replaced by a series connection of two N-MOS devices, one transistor operating as current-source with a controlled gate voltage and the second transistor as cascode, with its gate tied to a constant voltage in order to increase the output impedance of the current-source transistor 560 or 570.

Note too that in the sketched circuit input transistor 540 optionally may be replaced by a series connection two N-MOS devices, one transistor operating as source-follower similar to transistors 540 and a second transistor in series operating as cascode, with its gate tied to a constant voltage. In this embodiment the output impedance of the source-follower transistor 540 is increased thus obtaining a higher loop-gain.

Figure 5B:
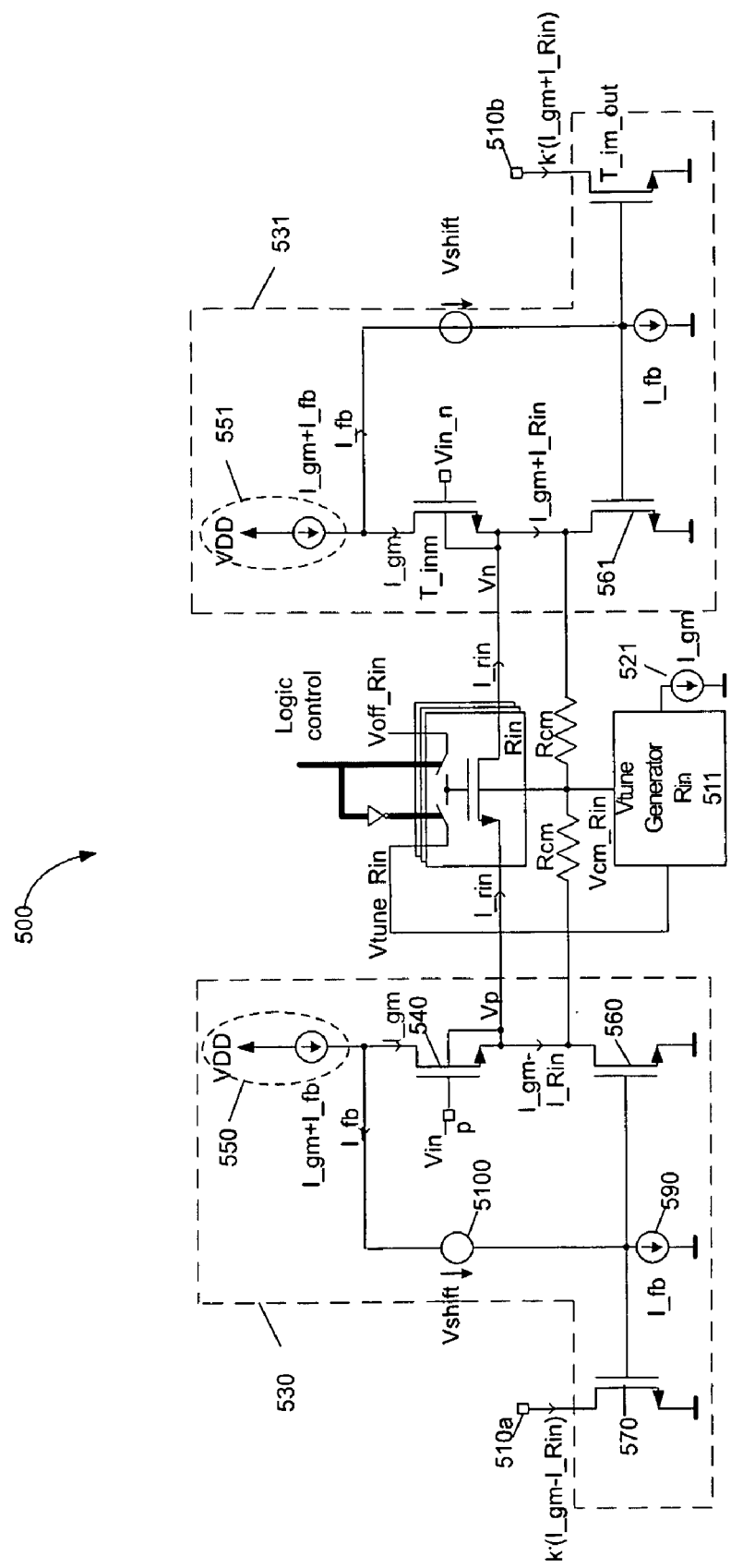

As depicted in FIG. 5b the feedback loop in another embodiment may be implemented using current source 590 for controlling feedback current I_fb and a voltage source 5100 providing a voltage $V_{shift}$ for shifting the voltages applied to the gates of feedback transistor 560 and mirror transistor 570. This voltage shift affects an optimum headroom for operation of transistors 540 and 560 in saturation. Similar as noted for the previous figure input transistor 540, feedback transistor 560 and mirror transistor 570 may be designed with additional cascodes to increase the transistor output resistance.

Note that in a variation of this embodiment voltage $V_{shift}$ may be zero, such that the gates of transistors 560, 570 are shorted to the drain of input transistor 540. Current source 590 then may be omitted as I_fb is zero.

Figure 5C:
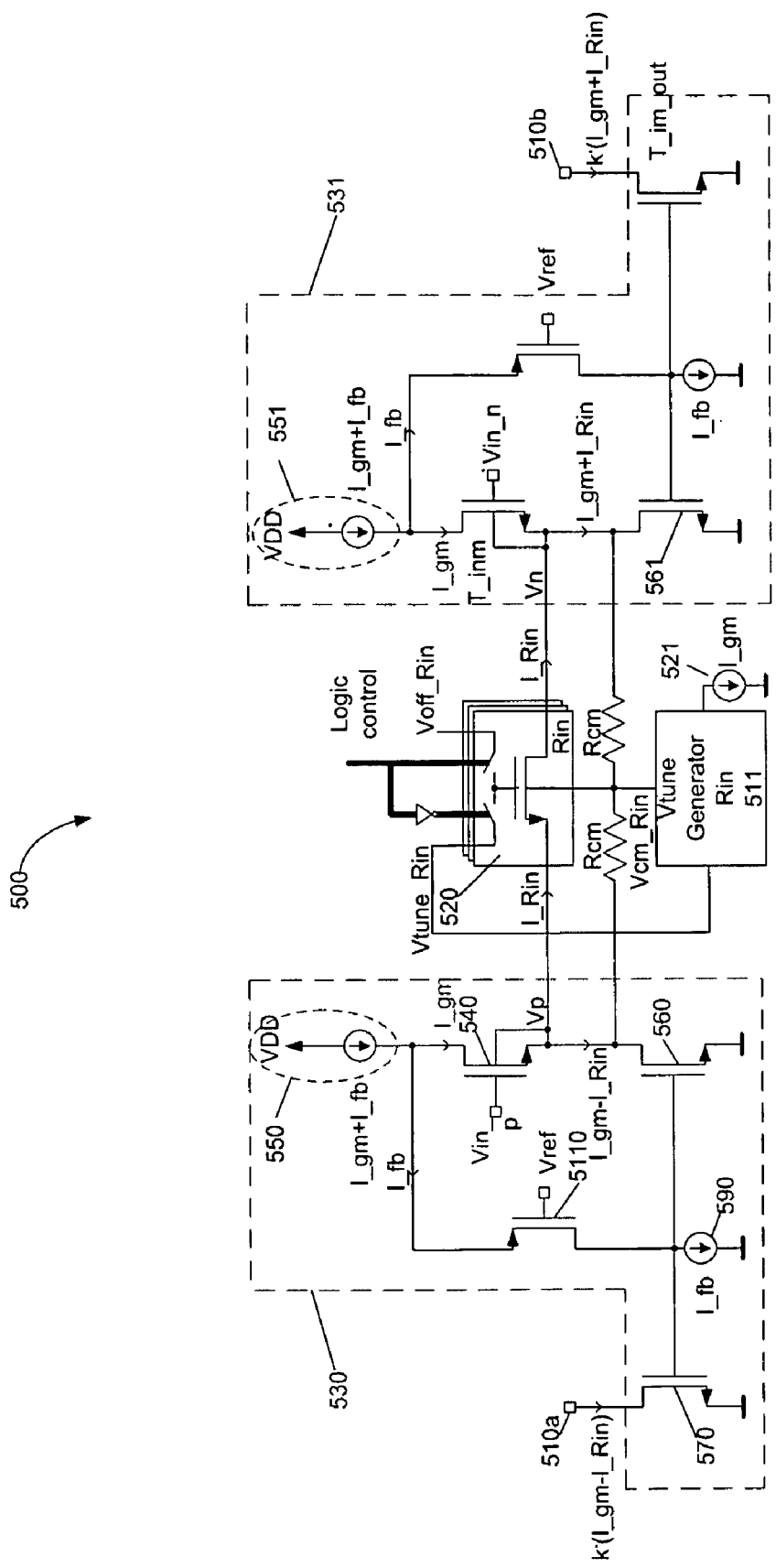

As depicted in FIG. 5c the feedback loop in another embodiment may be implemented using a P-MOSFET 5110 coupled with its P-MOS source to the drain of input transistor 540 and its drain coupled to the gate of feedback transistor 560 and to the gate of mirror transistor 570. The gate of P-MOS transistor 5110 is coupled to a reference voltage $V_{ref}$. The P-MOS transistor 5110 therefore operates as a folded-cascode device. The high impedance node in this embodiment no longer is at the drain of the input transistor 540 but at the gate of the feedback transistor 560. Operation conditions can therefore be optimized for lower supply voltages.

Similar as described for FIGS. 5a, 5b in this embodiment transistors 540, 560, 570 optionally may be implemented with an additional cascode. Thereby the obtainable loop-gain can be increased about 10-times. A further improvement in loop-gain can be obtained by adding a cascode to the P-MOSFET 5110 to.

Figure 5D:
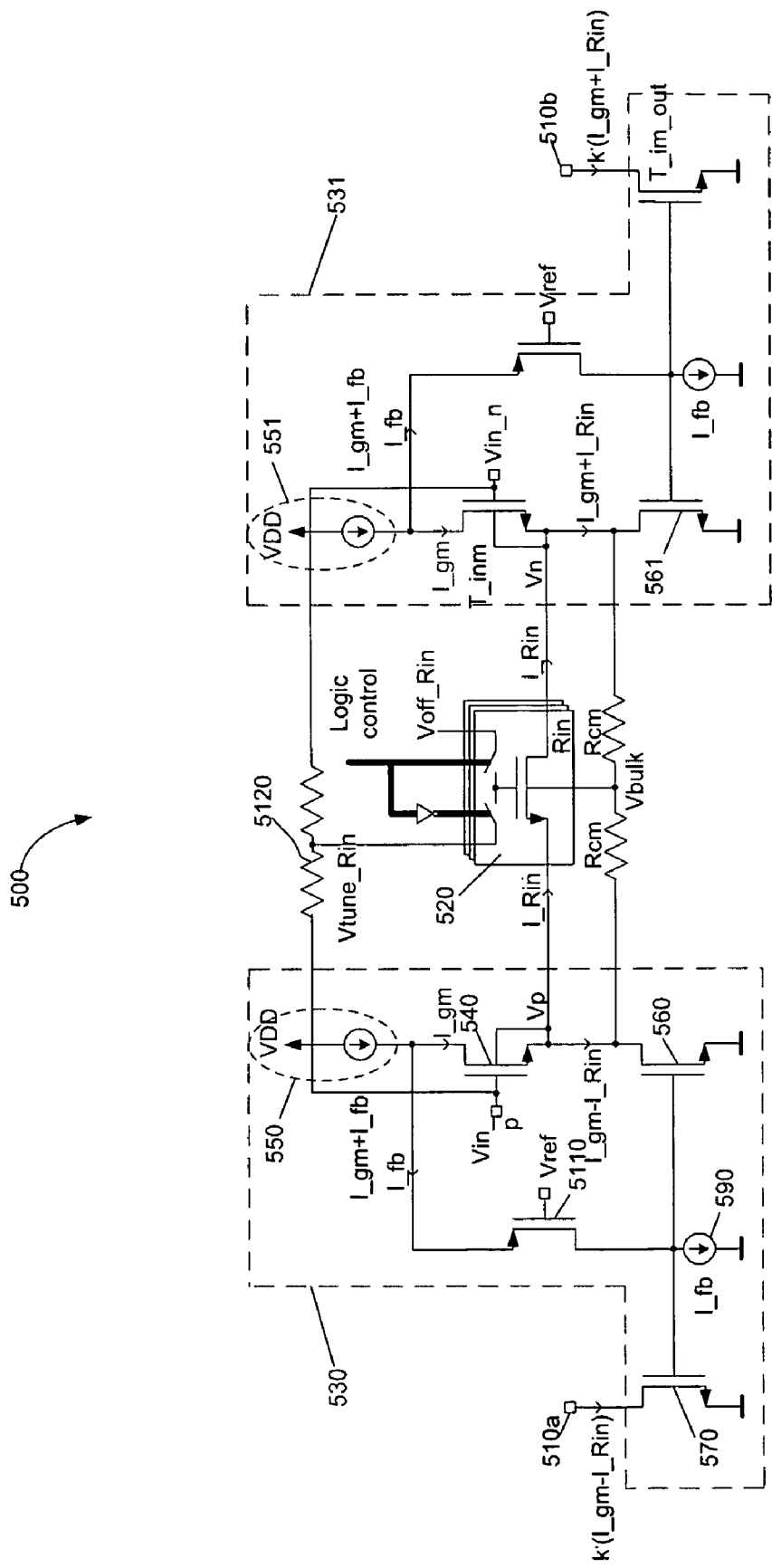

In one embodiment given in FIG. 5d the tuning voltage generator 511 and bias current source 521 as depicted in FIGS. 5a-5c can even be removed. This is possible if the input transistors 540, 541 are biased to obtain a constant transconductance, e.g., by sourcing an appropriate bias current I_gm through sources 550, 551. As devices 540, 541 are operated in saturation they are comparable in their operating point to the diode-connected transistor 212 in FIG. 2. Transistors 540, 541 force the common-mode voltage at nodes Vp, Vn and hence the source and drain of the input resistor Rin 520. Thus operation according to the principle described above can be achieved by matching the average gate-source voltages of saturated transistors 540, 521 and the MOSFET resistor 520. For this purpose a control voltage can be generated from the input common-mode voltage $V_{tune\_Rin}=(V_{in\_p}+V_{in\_n})/2$ as tuning voltage for resistor 520, wherein the voltage Vtune_Rin may be produced by using a voltage divider 5120 coupled to the input signals Vin_p and Vin_n. In one embodiment the voltage divider comprises two high-ohmic resistors of same resistance value in series thus allowing to tap Vtune_Rin at a center tap of divider 5120.

Figure 6:
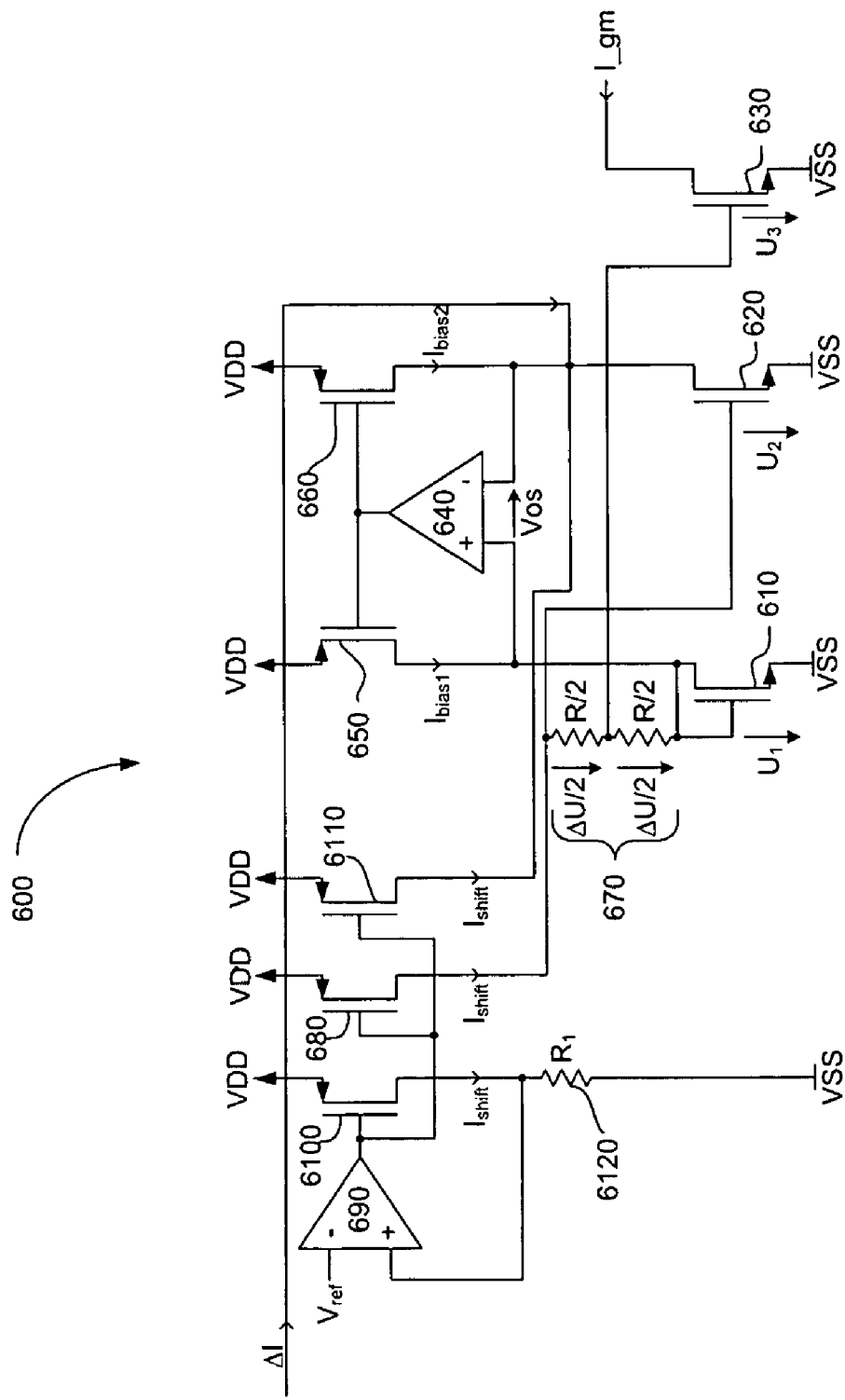
FIG. 6 depicts an embodiment of a current source circuit for providing a gm-constant current.

In FIG. 6 an embodiment of a current source providing a current I_gm is shown.

Starting from the fact that MOSFET devices, which are operated in saturation, show a quadratic relation between gate voltage and drain current, i.e., $$I = k \cdot U^2 \qquad (7)$$

with

I being the drain current,
U being the gate voltage
k being a constant, depending on device specifics, then the transconductance of the device is the derivative with respect to U, which is given as:

$$\frac{\delta I}{\delta U} = 2 \cdot k \cdot U. \qquad (8)$$

For three MOSFET devices operating at voltages $U_1$, $U_2$ and $U_3$ the derivative of the current-to-voltage relation, i.e. the transconductance, in operating point $U_3$ is the quotient of $\Delta I/\Delta U$, if the following equations hold for the operating points of $U_1$ and $U_2$:

$$I_1 = k \cdot U_1^2 \qquad (9)$$

$$I_2 = k \cdot U_2^2 \qquad (10)$$

$$U_2 = U_1 + \Delta U \qquad (11)$$

$$I_2 = I_1 + \Delta I \qquad (12)$$

and wherein $U_3$ is at the mid between $U_1$ and $U_2$:

$$U_3 = U_1 + \frac{\Delta U}{2} = U_2 - \frac{\Delta U}{2}. \qquad (13)$$

Figure 7:
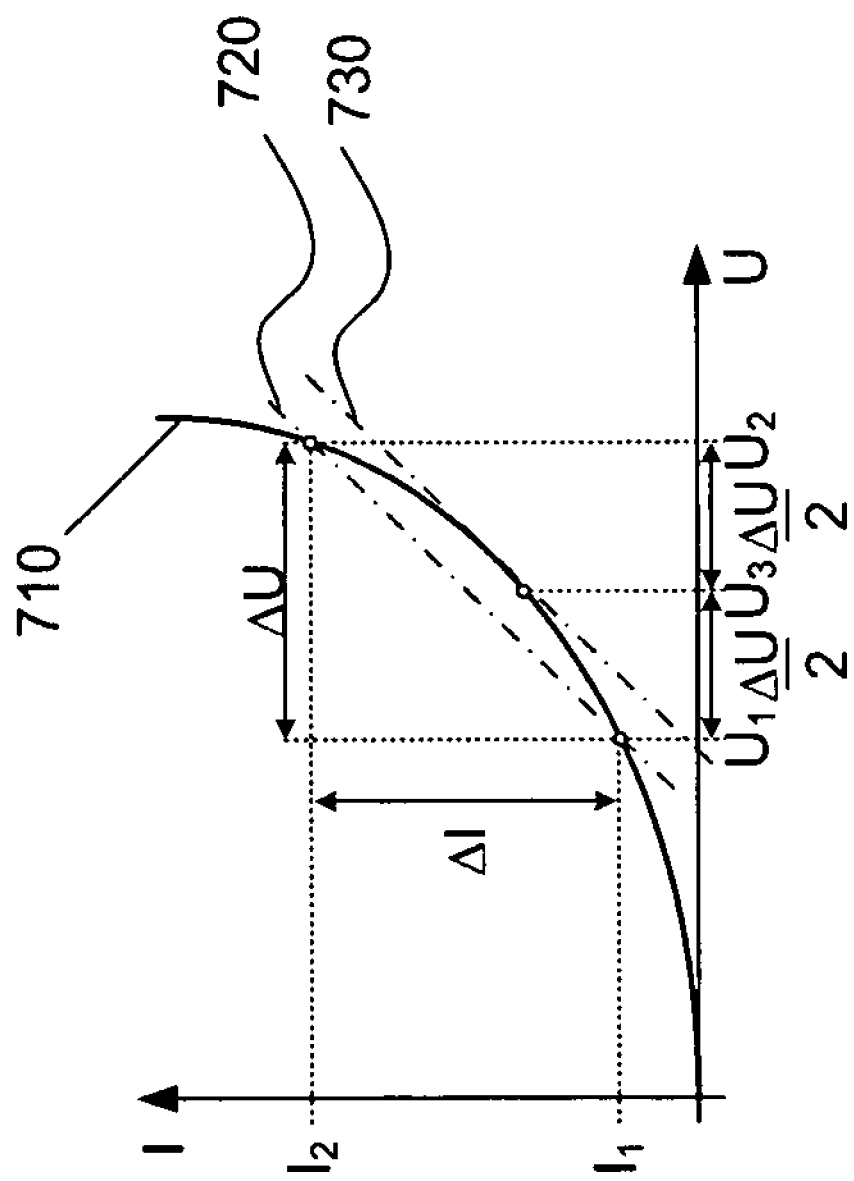
FIG. 7 depicts a quadratic curve for illustrating the context of the current source circuit.

In other words the derivative of a secant between any two points on a quadratic curve matches the derivative of a tangent to the curve at the mid-point between the crossing points of the secant with the quadratic curve, which is illustrated in FIG. 7. Voltages $U_1$, $U_2$ and $U_3$ are located on quadratic curve 710. Secant 720 runs through operating points $U_1$, $I_1$ and $U_2$, $I_2$. Tangent 730 is the derivative of quadratic curve 710 at operating point $U_3$, $I_3$, wherein $U_3$ is in the mid between $U_1$ and $U_2$. As tangent 730 is parallel to secant 720 it is apparent that the derivative of secant 720 matches the derivative of tangent 730.

The transconductance of a device having an operating curve 710 as depicted in FIG. 7 at operating voltage $U_3$ thus can be set by applying the voltage. Accordingly if a first and a second MOSFET device, for example, N-MOSFETs, are operated in saturation and under the above given conditions at operating voltages $U_1$, $U_2$, then the transconductance of a third MOSFET device can be controlled to be:

$$gm3 = \Delta I/\Delta U.$$

Turning now back to circuit 600 in FIG. 6 NMOS transistor 610 is operated at a gate-source voltage of $U_1$, wherein transistor 610 is diode-connected and hence always is operated in saturation. NMOS transistor 620 is operated at a gate-source voltage of $U_2$, wherein $U_2 = U_1 + \Delta U$ is true. NMOS transistor 630 is operated at a gate-source voltage of:

$$U_3 = U_1 + \frac{\Delta U}{2} = U_2 - \frac{\Delta U}{2}.$$

The drains of NMOS transistors 610, 620 are coupled to the input terminals of operating amplifier 640, which controls its output so as to minimize its input voltage difference Vos. The output of amplifier 640 is coupled to transistors 650 and 660, which here serve as current sources. Transistors 650 and 660 accordingly control currents $I_{bias1}$ and $I_{bias2}$ such that the drain voltage of transistor 620 equals the drain voltage of transistor 610. That is, since the gate voltage $U_2$ of transistor 620 is higher than the gate voltage $U_1$ of transistor 610, $I_{bias2}$ exceeds Ibias1 by ΔI, confer above given equation 12. Furthermore, as the drain voltages of transistors 610 and 620 are equal and diode-connected transistor 610 is operated in saturation, transistor 620 is operated in saturation also. Note that for providing the same currents transistors 650 and 660 are similar, i.e., the width to length ratio of their conducting channel and the threshold voltages are similar.

Transistor 630, which is controlled by $U_3$ as mentioned above, thus is controlled to provide a gm-constant bias current I_gm. Note that also transistors 610, 620 and 630 are of the same type and have similar characteristics, i.e. the same width to length ratio of the conducting channel and the same threshold voltages.

To provide a voltage difference of ΔU circuit 600 comprises a voltage divider 670, which in its simplest form comprises two ohmic resistors of equal resistance value, through which a current $I_{shift}$ is forced by transistor 680. For providing the current the circuit is coupled to a reference voltage Vref, which is coupled to operating amplifier 690. Amplifier 690 buffers the reference voltage across on-chip resistor $R_1$ 6120, and which controls transistor 6100 to output a current $I_{shift}$ as $I_{shift}=V_{ref}/R_1$ with $R_1$ being an ohmic precision resistor of the same type as voltage divider 670. A typical value for $V_{ref}$ is a bandgap voltage 1.2 V. The value of the floating voltage ΔU can be determined by the ratio of resistor R and $R_1$. A typical value is 50 mV.

Transistor 6100 accordingly serves as a current source providing the current $I_{shift}$. Transistors 680 and 6110 serve as current mirrors of transistor 6100 as they share its gate voltage and are coupled to the same supply voltage. Accordingly transistor 680 outputs a current $I_{shift}$ flowing through voltage divider 670 and transistor 610 to dissipate to $V_{SS}$, and transistor 6110 outputs a current $I_{shift}$ of same amplitude flowing through transistor 620, such that a current of $I_{shift}$ flows through each of the transistors 610 and 620. Note that for providing the same current $I_{shift}$ when controlled by the same gate voltage transistors 680, 6100 and 6110 are of same width to length ratio and have same threshold voltages.

Under the described biasing conditions the transconductance of transistor 630 is hence determined by gm3=ΔI/ΔU.

At startup of the circuit current ΔI, which is provided to the negative input of amplifier 640 is pulling up the voltage at the negative input thus forcing amplifiers output voltage low, which increases at least $I_{bias2}$ until a stable operation point has been reached.

In an alternative embodiment the current ΔI can be provided to the gate of transistor 610, such that the drain current of transistor 610 is reduced by ΔI.

The voltage difference ΔU between the gates of transistors 610 and 620 and the voltage difference ½·ΔU is thus controlled by voltage divider 670 forming a series of two floating voltage sources each providing a voltage of ½·ΔU. As the resistance values of voltage divider 670 can be produced with high precision the voltage differences between the transistor gates can be controlled accurately. Furthermore operating amplifier 690 is coupled directly to the drains of transistors 610 and 620 respectively such that an input offset voltage of amplifier 690 can be disregarded. Also the number of involved components is small thus reducing the number of elements contributing to statistical errors or mismatches.

In another embodiment circuit 600 is extended to further adjust the constant-gm current I_gm by adding a controllable current multiplier to the output. This can be achieved by using a number of n equal or weighted copies of transistor 630. The gates of these transistors either can be switched in parallel to transistor 630, such that these are controlled by the same gate voltage and their output current adds to that of transistor 630, or the gates can be coupled to Vss thus switching the transistors off.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiments disclosed.

What is claimed is:

1. An integrated circuit comprising:
   a diode-connected MOSFET that includes a drain coupled to an output and a source coupled to a negative input of an operational amplifier, the drain of the diode-connected MOSFET also being coupled to a current source; and
   a linearly-operated MOSFET that includes a gate coupled to an output of the operational amplifier, wherein an average of source and drain voltages of the linearly-operated MOSFET is coupled to a positive input of the operational amplifier.

2. The integrated circuit of claim 1, wherein the current source is configured and adapted to draw a current through the diode-connected MOSFET such that the diode-connected MOSFET maintains a transconductance that is substantially constant over process, temperature and voltage variations.

3. The integrated circuit of claim 1, further comprising a voltage divider coupled between the source and the drain of the linearly-operated MOSFET such that the average of the source and drain voltages is provided at a center tap of the voltage divider.

4. The integrated circuit of claim 3, wherein a bulk of the linearly-operated MOSFET is shorted to the center tap of the voltage divider.

5. The integrated circuit of claim 1, wherein the diode-connected MOSFET is source-bulk shorted.

6. The integrated circuit of claim 1, wherein the diode-connected MOSFET and the linearly-operated MOSFET are of same conductance type, same oxide thickness and have same threshold voltages.

7. The integrated circuit of claim 6, wherein the average of the source and drain of the linearly-operated MOSFET is determined by a third circuit.

8. The integrated circuit of claim 7, wherein the operational amplifier sets a common voltage at the source of the diode-connected transistor to a target average voltage determined by the third circuit and thereby can adapt to arbitrary common mode voltages.

9. The integrated circuit of claim 6, wherein the diode-connected MOSFET and the linearly-operated MOSFET are N-MOSFETs.

10. The integrated circuit of claim 1, wherein the current source comprises:
    a first diode-connected MOSFET operated at first gate voltage;
    a second MOSFET operated at a second gate voltage exceeding the first gate voltage; and
    a third MOSFET operated at a gate voltage being the mid of the first and second gate voltage.

11. The integrated circuit of claim 10, wherein the first diode-connected MOSFET includes a drain coupled to a positive input of a second operational amplifier and the second MOSFET includes a drain coupled to a negative input of the second operational amplifier, the second operational amplifier having an output that controls a first current source providing a current to the first diode-connected MOSFET and a second current source providing a current to the second MOSFET.

12. The integrated circuit of claim 11, wherein the first and second current source each comprise a P-MOSFET.

13. The integrated circuit of claim 12, wherein the ratio of a difference of the drain currents ΔI of the first and second MOSFETs and a difference ΔU of the gate voltages of the first and second MOSFETs determines the transconductance of the third MOSFET.

14. The integrated circuit of claim 13, wherein the difference ΔU between the gate voltages of the first and second MOSFETs is set by two resistors in a series connection through which a current is forced.

15. The integrated circuit of claim 14, wherein the difference of the drain currents ΔI of the first and the second MOSFETs is provided by a current source.

16. The integrated circuit of claim 11, wherein an offset voltage of the second operational amplifier has a negligible affect on the transconductance of third MOSFET.

17. An integrated circuit comprising a variable gain amplifier including an input stage and an output stage, wherein at least one stage comprises:
a tuning voltage generator circuit; and
a MOSFET with a source, a drain and a gate, wherein an average of a source voltage and drain voltage of the MOSFET is coupled to the tuning voltage generator and wherein the gate is coupled to the tuning voltage generator circuit such that the tuning voltage generator circuit provides a control voltage to operate the MOSFET as a linear resistor.

18. The integrated circuit of claim 17, wherein the input and output stages are separated by an intermediate signal processing stage operating in the current domain, the intermediate signal processing stage receiving a differential input current from the input stage and providing a differential current to the output stage.

19. The integrated circuit of claim 18, wherein the intermediate stage performs a signal processing task.

20. A circuit comprising:
an operational amplifier having a positive input, a negative input and an output;
a current source;
a first MOSFET having a source, a drain and a gate, the source being coupled to the negative input of the operational amplifier and the drain being coupled to the current source;
a second MOSFET having a source, a drain and a gate, the gate being coupled to the output of the operational amplifier; and
a voltage divider coupled between the source and the drain of the second MOSFET such that an average of the source and drain voltages is provided at a center tap of the voltage divider, the center tap coupled to the positive input of the operational amplifier.

* * * * *